(12) United States Patent
Hughes et al.

(10) Patent No.: US 8,560,925 B2
(45) Date of Patent: Oct. 15, 2013

(54) SYSTEM AND METHOD FOR HANDLING BAD BIT ERRORS

(75) Inventors: Brian William Hughes, Rochester Hills, MI (US); Hiroaki Shibata, Novi, MI (US); Wan-ping Yang, Farmington Hills, MI (US)

(73) Assignees: DENSO International America, Inc., Southfield, MI (US); Denso Corporation, Kariya-shi, Aichi-ken (JP)

( * ) Notice: Subject to any disclaimer, the term of this patent is extended or adjusted under 35 U.S.C. 154(b) by 363 days.

(21) Appl. No.: 13/079,875

(22) Filed: Apr. 5, 2011

(65) Prior Publication Data
US 2012/0260148 A1 Oct. 11, 2012

(51) Int. Cl.
*G11C 29/00* (2006.01)
(52) U.S. Cl.
USPC .......................................................... 714/773
(58) Field of Classification Search
USPC .......................................................... 714/773
See application file for complete search history.

(56) References Cited

U.S. PATENT DOCUMENTS

| 7,397,713 B2 * | 7/2008 | Harari et al. ............... 365/200 |
| 2011/0029749 A1 * | 2/2011 | Yang et al. ................ 711/162 |
| 2011/0191655 A1 * | 8/2011 | Schreck et al. ............ 714/773 |

FOREIGN PATENT DOCUMENTS

JP 1076338 3/1989

* cited by examiner

*Primary Examiner* — Albert Decady
*Assistant Examiner* — Enam Ahmed
(74) *Attorney, Agent, or Firm* — Harness, Dickey & Pierce, P.L.C.

(57) ABSTRACT

A method and system for detecting and correcting a bad bit error in a solid-state nonvolatile memory device. The device includes a bad bit detection module that receives an old page from the memory device and determines whether a page has a bad bit. The device further includes a bad bit correction module that generates a new page, determines a location of the bad bit, determines a preferred value of the bad bit, determines a user value of the bad bit and inserts the preferred value into a string of bits corresponding to substantive data of the old page, recording the string of bits with the preferred value inserted therein and stores the new page at an address of the old page.

18 Claims, 9 Drawing Sheets

SYSTEM AND METHOD FOR HANDLING BAD BIT ERRORS

FIELD

The present disclosure relates to a system and method for handling errors in a page of memory. In particular, the present disclosure relates to a method and system for remapping the spare data area of a page of memory to handle permanent bit errors.

BACKGROUND

The vast majority of electronic devices include at least one microcontroller or microprocessor that controls the operation thereof. In order to perform the desired functionality a microcontroller will execute code or executable instructions for performing specific operations. The microcontroller may also retrieve data for performing these operations. The code and data are stored in the computer readable memory device. Increasingly, manufacturers are using solid-state nonvolatile memory devices such as flash memory devices, e.g. NAND flash memory devices or NOR flash memory devices, as the computer readable memory devices.

One issue that arises with flash memory devices, however, is that read-inability errors are more commonly observed in flash memory devices, and especially in NAND flash memory. Read-inability errors can be permanent such as a bad block error, e.g. a bit within the block has been physically damaged, or temporary such as a data retention error or a read disturb error. Manufacturers of devices having non-volatile memory, such as flash memory devices, utilize error correction codes (ECC) to correct bit errors that occur in the memory device. During normal operation of the device when data is written to a memory device, ECCs are generated for that data by the hardware of the memory device and automatically stored with the data. On subsequent reads, the ECC is read back and used by the hardware to correct errors in the data. ECC codes can be parameterized during the hardware design phase to correct a fixed number of errors while using a given amount of storage overhead. Once ECC parameters are selected and implemented in the hardware, the ECC circuitry cannot be modified to correct more errors than the ECC scheme was originally designed for. When a read error occurs during normal system operation, it may be determined that there are more errors in the data than the ECC algorithm can fix. In these situations, the data is not recoverable. Thus, if the system designer requires stronger ECC algorithms than are implemented in the hardware ECC, the hardware ECC can be disabled and a stronger ECC algorithm can be executed by the microcontroller of the device. However, these ECC algorithms may decrease the overall performance of the microcontroller when reading and writing to the flash memory device.

As mentioned above, some errors may be temporary errors. Temporary errors in the data stored in the flash memory device accumulate over time due to interference from internal and external events that occurred during the normal system operation. Temporary errors occur in memory cells that do not have any physical defects. Because the memory cells are not defective, the correct data can be restored by performing a refresh operation on the block or page of data, which will include ECC-based error corrections, followed by a rewrite of the corrected data.

Permanent errors, however, cannot be fixed by refresh operations. Unlike temporary errors, permanent errors are typically caused by physical defects in the memory. While the ECC can correct permanent errors, the amount of errors that the ECC can correct is limited. Thus, there is a need for a more efficient way to handle permanent errors, as well as temporary errors, in memory devices, such as a flash memory device.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A device configured to correct bad bit errors is disclosed. The device includes a solid-state nonvolatile memory device divided into a plurality of blocks, each block containing a plurality of pages, each page having a main area that stores substantive data and a spare area, and each spare area having a validity bit field indicating whether a bit in the main area is in an error state, a bad bit location field indicating the bit in the main area that is in the error state, a preferred value field indicating a likely value of the bit in the main area that is in the error state, and a user value field indicating a correct value of the bit in the error state. The device further comprises a main controller that performs at least one function of the device including a bad bit detection module that receives an old page from the solid state nonvolatile memory device and determines whether a page has a detected bit in an error state and a bad bit correction module that a) generates a new page, b) determines a location of the detected bit in the error state and records the location of the detected bit in the error state in a bad bit field of the new page, c) determines a preferred value of the detected bit in the error state and records the preferred value of the detected bit in the error state in a preferred value field of the new page, d) determines a user value of the detected bit in the error state and records the user value of the detected bit in the error state in a user value field of the new page, e) inserts the preferred value into a string of bits corresponding to substantive data recorded in a main area of the old page, and recording the string of bits with the preferred value inserted therein in a main area of the new page, and f) stores the new page at an address of the old page.

In another aspect of the disclosure, a method for correcting bad bit errors in a solid-state nonvolatile memory device is disclosed. The solid-state nonvolatile memory device is divided into a plurality of blocks. Each block contains a plurality of pages and each page includes a main area that stores substantive data and a spare area. Each spare area includes a validity bit field indicating whether a bit in the main area is in an error state, a bad bit location field indicating the bit in the main area that is in the error state, a preferred value field indicating a likely value of the bit in the main area that is in the error state, and a user value field indicating a correct value of the bit in the error state. The method comprises receiving an old page from the solid state nonvolatile memory device and determining whether a page has a detected bit in an error state. When the detected bit is an error state, the method further comprises generating a new page and determining a location of the detected bit in the error state and recording the location of the detected bit in the error state in the bad bit field of the new page. The method further comprises determining a preferred value of the detected bit in the error state and recording the preferred value of the detected bit in the error state in the preferred value field of the new page. The method also includes determining a user value of the detected bit in the error state and recording the user value of the detected bit in the error state in the user value field of the new page. The method further comprises inserting the preferred value into a string of bits corresponding to substantive data of the old page, and recording the string of bits with the preferred value inserted therein in a main area of the new page. The method also includes storing the new page at an address of the old page.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
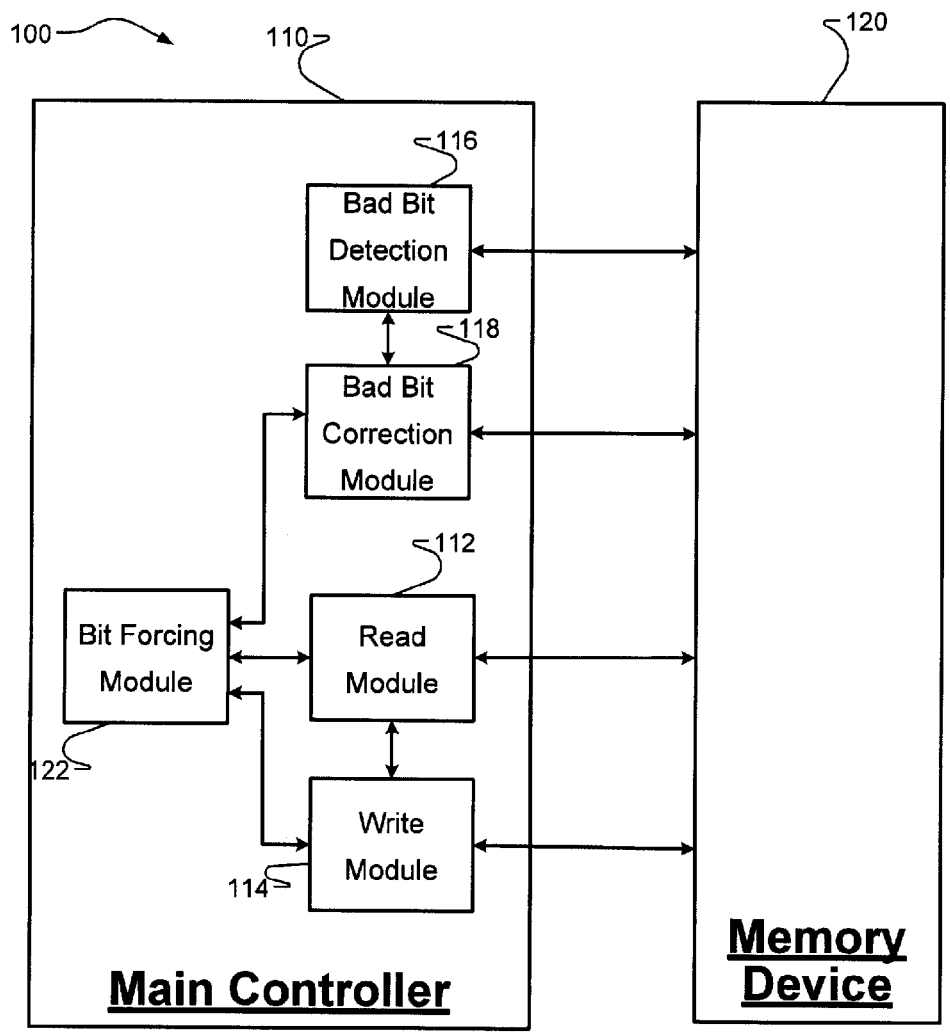
FIG. 1 is a block diagram illustrating exemplary components of a device configured to detect and handle bad bit errors in a memory device.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

FIG. 1 illustrates components of an exemplary device 100 or a subsystem of the device 100. The device 100 includes a main controller 110 for operating the device 100 and a flash memory device 120 that stores executable instructions for operating the device 100. The memory device 120 further stores data that may be used by the main controller 110. The main controller 110 includes, but is not limited to, a read module 112, a write module 114, a bad bit detection module 116, a bad bit correction module 118, and a bit forcing module 122.

The read module 112 is configured to read data from the memory device 120 that has been previously mapped by the bad bit correction module 118. The read module 112 will transmit an address to the memory device 120 and the memory device 120 will return a data block corresponding to the requested address.

The write module 114 is configured to write data to the memory device 120 using a remap operation such that a page with a bad bit can remapped to compensate for the bad bit error. The write module 114 will transmit an address to write the data, as well as the data to be written.

The bad bit correction module 118 is configured to determine if a page in the data block has a permanent bit error, and if the page has a permanent bit error, the bad bit correction module 118 will remap the page of memory such that a portion of a spare data area of the page of memory is used to store the value of the damaged bit. As will be discussed in greater detail below, the bad bit correction module 118 will determine the location of a bad bit in a page, a preferred value of the bad bit, and a user value for the bit and will use the spare data area of the page such that the correct data can be reconstructed upon a read operation. As will be described below, the bad bit correction module 118 will utilize the bad bit detection module 116 to execute a refresh operation of a page and to determine if the page has a bad bit contained therein.

The bad bit detection module 116 is configured to determine if a page has a bad bit contained therein. The bad bit detection module 116 performs an enhanced refresh operation such that the bad bit detection module 116 refreshes a page of memory and detects permanent bit errors in each page of a block in the memory device 120. As will be discussed in greater detail below, the bad bit detection module 116 reads a page of data with ECC enabled, writes the corrected page back to the memory device 120, reads the same data with the ECC disabled, and compares the data from each read to determine if a page contains a bad bit.

The bit forcing module 122 is configured to receive a chunk of data, a location of a bit in the chunk of data, and a value to be inserted in the chunk of data at the received bit location. The bit forcing module 122 is used by the read module 112 to reconstruct a page of data that has a bad bit error and by the write module 114 to force a preferred value at a bad bit location in the chunk of data to be written with a remap. Once the preferred value is written into the chunk of data, the bit forcing module 122 returns the updated chunk of data to the requesting component.

The memory device 120 is configured to receive read and write requests from the main controller 110. It is appreciated that in some embodiments the memory device 120 is a solid-state, nonvolatile memory device, such as a flash memory device. Further, the flash memory device can be comprised of NAND flash memory or NOR flash memory. It is further noted that later developed memory devices 120 may also be used in the device 100.

Figure 2A:
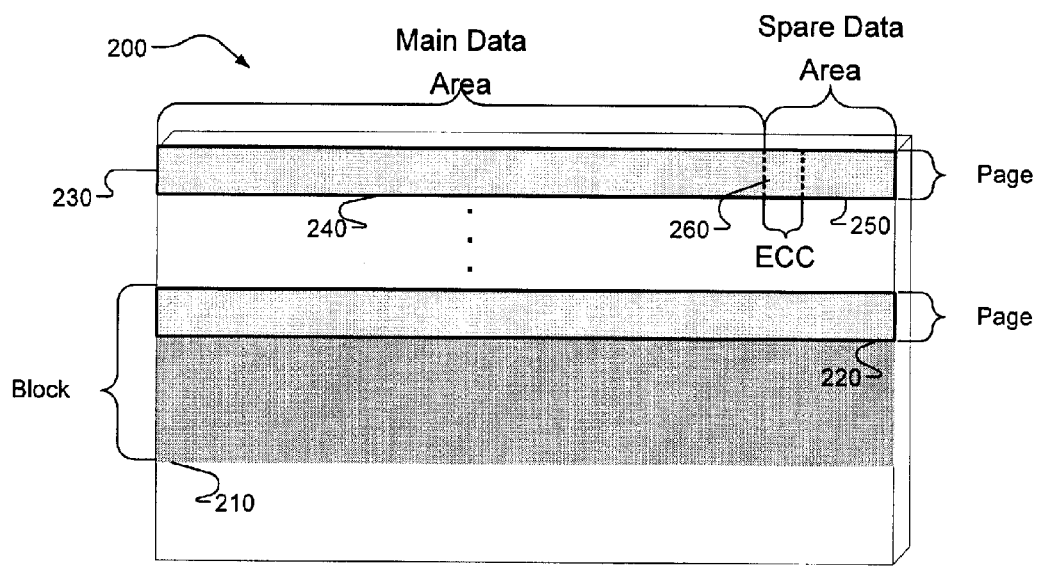
FIGS. 2A and 2B are drawings illustrating an exemplary structure of a memory device
Figure 2B:
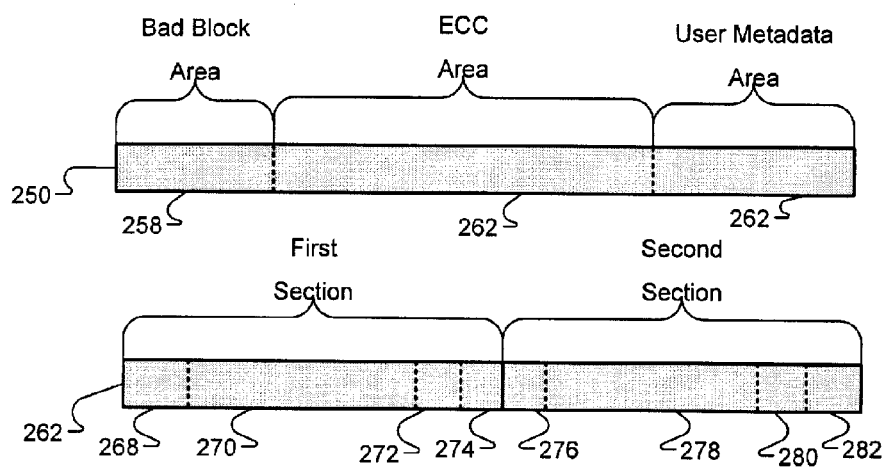

As mentioned, in some embodiments the memory device 120 is a solid-state nonvolatile memory device. FIGS. 2A and 2B illustrate an exemplary structure of the solid-state nonvolatile memory device 200. For purposes of this example, the solid-state nonvolatile memory device 200 is a flash memory device. The flash memory device 200 is divided into a plurality of blocks 210. For instance, an exemplary flash memory device 200 can be divided into 1,028 blocks. Further, a block is divided into a plurality of pages 220. For instance, an exemplary block 210 can be divided into 64 pages. A page 230 is comprised of a plurality of bytes. For instance, an exemplary page 230 can be comprised of 2,112 bytes. Additionally each page 230 can be broken down into four read units of 528 bytes apiece (not shown). It is appreciated that the foregoing values are exemplary and other configurations of the flash memory device 200 are envisioned. For instance a block may be comprised of 32 pages and a page may be comprised of 4,048 bytes. Furthermore, the foregoing structure may be applied to different types of memory devices as well.

A page 230 is divided into a main data section 240 and a spare data area 250. The main data section 240 contains the substantive data to be stored. For instance, if the block is in the program area, the main data section 240 of a particular page 230 could correspond to a particular instruction. It is appreciated that addresses and parameter values can also be stored in the main data area 240 of a page 230. The spare data area 250 stores information relating to the page 230. The spare data area 250 includes a plurality of bytes 260 for the ECC. As discussed flash memory devices will include a memory controller (not shown) that executes an error checking algorithm to determine if any of the bits in the page contain an error. If so, the ECC section 260 of the spare data area 250 will indicate which bit or bits contain an error. As will be discussed below, the spare data area 250 contains additional information.

FIG. 2B illustrates an exemplary spare data area 250. The spare data area 250 is of pre-determined length, e.g., 128 bits. The spare data area 250 is further divided into a bad block area 258 of pre-determined length, e.g., 16 bits, an ECC field 260 of pre-determined length, e.g., 64 bits, and a user metadata section 262 of predetermined length, e.g., 32 bits. The user metadata section 262 in the spare data area 250 may or may not be protected by hardware ECC. It is appreciated if hardware ECC is not available then the main controller 110 will need to protect information in the user metadata section 262 using a checksum or a CRC.

The user metadata section 262 can be broken down into a first section 264 and a second section 266. Each section 264 and 266 can be used for correcting a bad bit error in the corresponding main data section. For example, the first section 264 can correct a first bad bit error in a first location and the second section 266 can correct a second bad bit error in a second location of the main data section 240. The first section 264 is divided into four sections. The first section is comprised of a first validity bit 268, a first bad bit location field 270, a first preferred value bit 272 and a first user bit 274. It is appreciated that the validity bit 268, the preferred value bit 272 and the user bit 274 are all one bit in length, while the bad bit location field is of sufficient length to store a bit location, e.g. 13 bits. Similarly, the second section will have a second invalidity bit 276, a second bad bit location field 278, a second preferred bit 280 and a second user bit 282.

The validity bit 268 indicates if the remaining data items in the first section 264 have been programmed. If there is not a bad bit detected in the main data section 240, then the validity bit is set to 0. If, however, a bad bit is detected, the remaining data in the first section must be initialized to valid values and the validity bit is set to 1.

The bad bit location field 270 indicates the location of the first bad bit error in the main data section 240. It is appreciated that the bad bit location field 270 must be of sufficient length so as to be able to address any bit location in the main data section 240. Thus, the number of bits required in the field is $Log_2 N$, where N is the bit-length of the main data area 240. It is also appreciated that a bad bit location of 0 can either indicate a bad bit at the most significant or least significant bit in the main data section 240. It is appreciated other addressing schemes may be utilized.

The preferred value bit 272 is the value for the bad bit that will result in the fewest ECC errors. For instance, if the bit is stuck at 0, that is the bit always reads 0 regardless of the value written to the particular bit location, the preferred value will be set to 0. Similarly, if a bit reads at 1 80% of the time, the preferred value will be set to 1.

The user value bit 274 is the value that main controller 110 expects to read at that location when a read occurs. For instance, if the bad bit always reads 0 but the bad bit should be set to 1, the user value will be 1.

It is appreciated that the number of bits that can be corrected by the foregoing fields is dependent on the amount of space available in the spare data area 250. For example, if each page has 8,192 regular data bits per main data area, 16 bits will be required for each entry in the spare data area, one for the validity bit, 13 for the bad bit location, one for the preferred value and one for the user value. If the spare data area 250 has between 32 and 47 bits available, two bad bits in the data area can be handled. If 48 bits are available than three bits can be handled, etc.

As mentioned, the bad bit correction module 118 is configured to correct for a bad bit error in a page of memory. The bad bit correction module 118 communicates with the memory device 120 to write a corrected page of memory thereto and with the bad bit detection module 116 to determine if a page of memory includes a bad bit.

Figure 3:
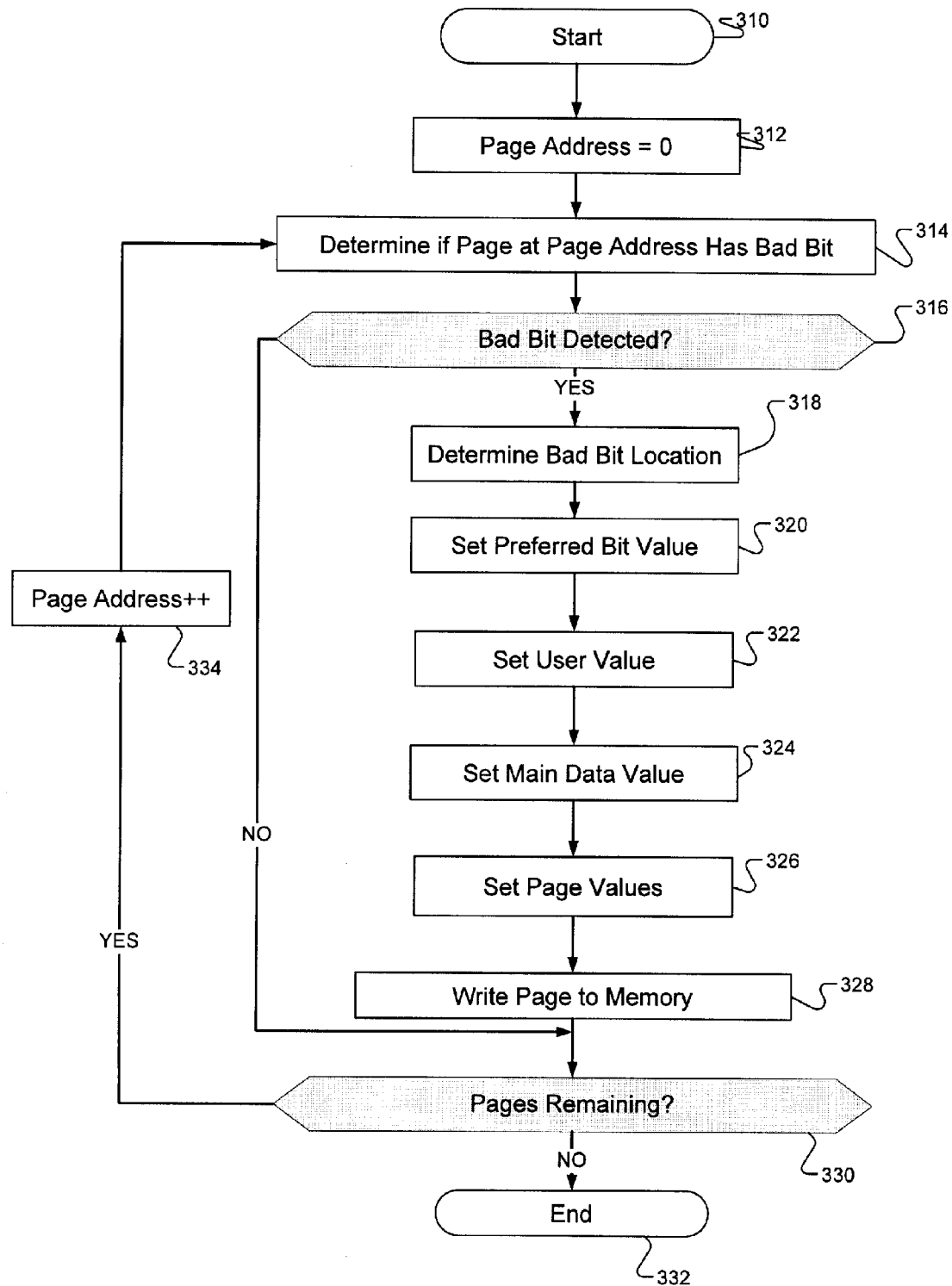
FIG. 3 is a flow chart illustrating an exemplary method for detecting a bad bit error in a page and handling the bad bit error.

FIG. 3 illustrates an exemplary method that may be executed by the bad bit correction module 118. The bad bit correction module 118 may execute the following method after a refresh operation, during a refresh operation, or at predetermined intervals. The bad bit correction module 118 may receive up to a full block and correct each page that requires correction. Thus, the bad bit correction module 118 is configured to iterate through a plurality of pages of memory. Accordingly, a page counter indicating a current page or a page address is set to 0, as shown at step 312. The bad bit correction module 118 will communicate the page counter to a bad bit detection module 116 to determine if the current page, i.e., the page located at page address, has a bad bit therein, as shown at step 314. As will be further described below, the bad bit detection module 316 will compare expected data against actual data to determine if a bad bit is contained in a page.

The expected data is data that should be read from the page being analyzed, whereas the actual data is the data found in the main data section of the page being read. If a discrepancy arises between the expected data and the actual data of the page, the bad bit detection module 116 will notify the bad bit correction module 118 of the existence of a bad bit. Thus, as shown at step 316, the bad bit correction module 118 will determine whether a bad bit was detected. If a bad bit is not detected, then the bad bit correction module 118 will determine if there are any pages remaining to be analyzed, as shown at step at 330, and will increment the page address if there are pages to be analyzed remaining.

If a bad bit was detected, then the bad bit correction module 118 will determine the location of the bad bit, as shown at step 318. As will be described below, the bad bit correction module can identify a bad bit using the expected data and the actual data. By performing an exclusive OR (XOR) operation on the expected data and the actual data and bit shifting the result, the location of the bad bit can be identified. It is noted that the bad bit correction module 118 can generate a data structure that will eventually be used to generate a page to be written to memory, the data structure containing fields for the main data, the bad bit location, the preferred bit value, and the user bit value. Thus, the bad bit correction module 118 can set the bad bit location field equal to the bad bit location.

Once the location of the bad bit is identified the bad bit correction module 118 will determine and set the preferred bit value of the bad bit, as shown at step 320. As previously discussed, the preferred value is the value that is most likely to be read at the bad bit location in the main data section of the current page. The preferred value can be set equal to the value read from the actual data at the bad bit location. Once the bad bit correction module 118 has determined the preferred bit value, the preferred bit value field is set to the preferred bit value. The user bit value field is set to the desired value of the bit located at the bad bit location, as shown at step 322. Once the bad bit location, the preferred bit value and the user bit value have all been set, the bad block correction module 118 will write to the main data section of a page, as shown at step 324. The main data section of a page will be written as the expected data but the bit located at bad bit location will be forced to the preferred bit value. As will be described below, the bit forcing module 122 will receive the expected data, the bad bit location and the preferred value and will generate a string of bits that represents the expected data with the preferred value at the bad bit location.

The data correction module 118 will then set the values of the page to be written to memory, as shown at step 326. The page to be written to memory is comprised of the main data area which has been manipulated by the bit forcing module 122, the validity bit value that is set to 1, the bad bit location that is set to the value of the bad bit location, the preferred bit value that is set to the preferred value, and the user bit value that is set to the user value. As can be appreciated, other fields such as the ECC fields or the bad byte field of the spare data area may also be populated. The collection of data is merged into a single string of predetermined length, e.g. the length of a page of memory. At this point an entire page has been generated and the page can be written to memory as shown at step 328. It is appreciated that the method will continue to analyze the remaining pages in the block being analyzed. Accordingly, the bad bit correction module 118 will determine if there are any pages remaining to be analyzed, as shown at step 330. If so, the method continues to execute and the page address is incremented as shown at step 334. Else, the bad bit correction module 118 stops executing, as shown at step 332.

As was discussed above, the bad bit detection module 116 will receive an address of a page of a block and will determine if a bad bit error is contained in the page. The following method describes a process to detect bit errors during a refresh operation that is used to remove temporary errors from a flash memory device 120. Specifically a refresh operation reads data from flash with ECC enabled and allows ECC to correct any errors and then writes the data back to flash. In the enhanced refresh operation described below, permanent bit errors are detected in the page.

Figure 4:
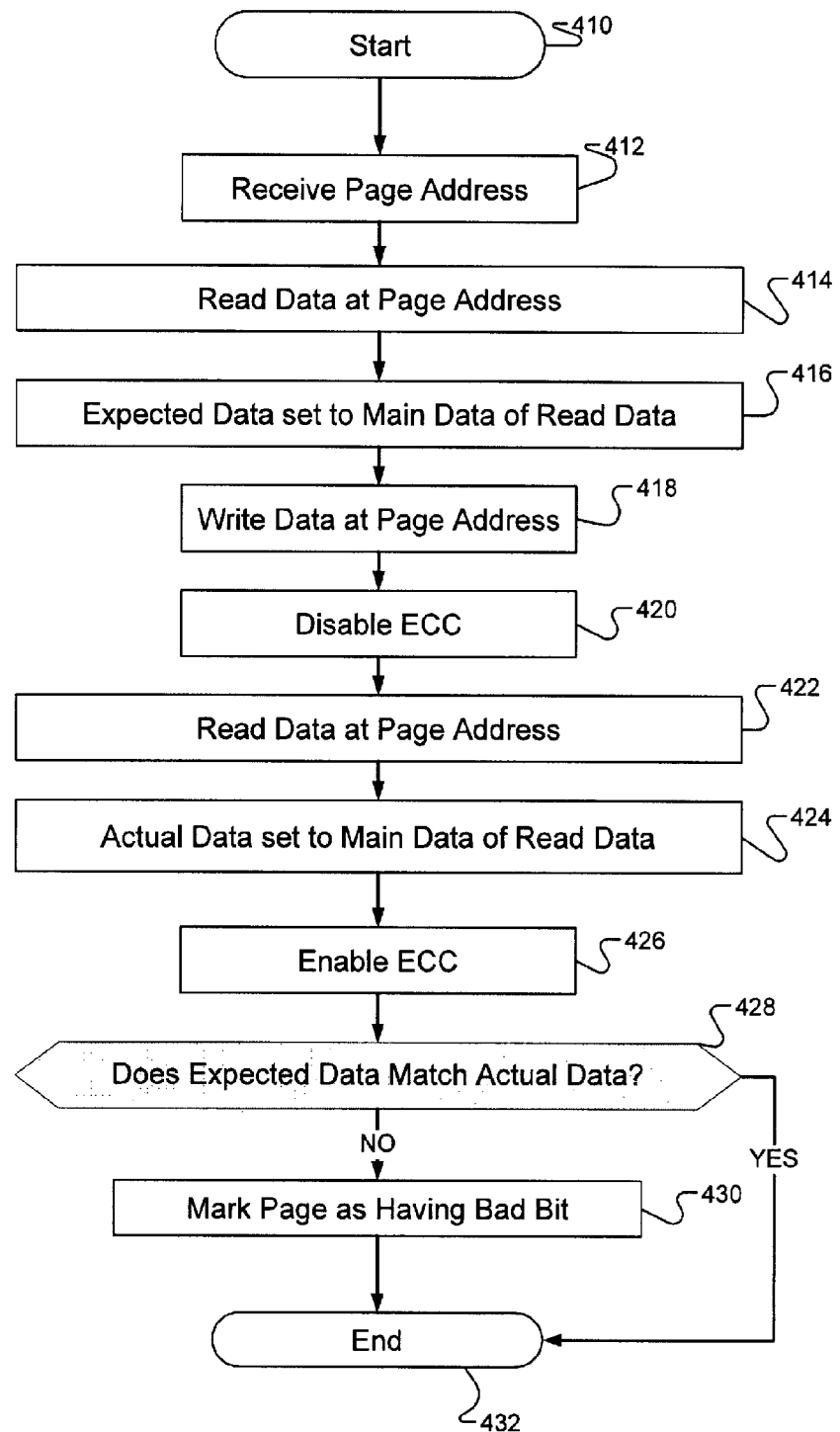
FIG. 4 is a flow chart illustrating an exemplary method for detecting a bad bit error in a page.

FIG. 4 illustrates a method that may be executed by the bad bit detection module 116 to determine whether a bad bit exists in the page and, if so, the location of the bad bit. Further, the illustrated method further performs a refresh of the page of memory. While the following method is shown as being executed with respect to a single page, it is appreciated that the method could continue to loop for each page in a block of memory.

The bad bit detection module 116 will receive a request from a component of the device 100, e.g. the bad bit correction module 118, indicating a page address to perform bad bit detection on, as shown at step 412. The bad bit detection module 116 will read the page at the requested page address as shown at step 414. It is appreciated that prior to the bad bit detection module 116 being called, the block containing the page address may have been loaded from the memory device 120. Upon retrieving the page found at page address, the bad bit detection module 116 will read the main data portion of the page, as shown at step 414. It is noted that the foregoing read is ECC corrected data.

The ECC corrected portion of the data is found in the main data area of the page of memory. This data is referred to as the expected data. The bad bit detection module 116 writes the expected data back to memory, as shown at step 418. The bad bit detection module 116 will then disable error correction as shown in step 420, and will read the page again but without having the error correction performed on the particular page, as shown at step 422. It is noted that the data found in the main data area of the uncorrected page is referred to the actual data. The bad bit detection module will get the data found in the main data area of the uncorrected page of memory, as shown at step 424, and reenable ECC, as shown at step 426.

As mentioned, the expected data is the ECC corrected data that was retrieved from the page, while the actual data is the uncorrected data retrieved from the page. To determine if there is any permanent bit errors in the page, the bad bit detection module 116 will compare the expected data with the actual data, as shown at step 428. If the expected data does not match the actual data, the bad bit detection module 116 will mark the page as having a bad bit error, as shown at step 440. When a page is marked as having a bad bit, the validity bit in the spare data area of the page will be marked to 1. If the expected data matches the actual data, the bad bit detection module 116 will not mark the page having a bad bit error and will stop executing, as shown at step 442.

It is appreciated that variations of the method may be implemented and are within the scope of this disclosure. For instance, the method may execute for an entire block of data, such that the method comprises a loop that executes until each page in the block has been analyzed in the manner described above. Further, it is noted that some of the steps shown with respect to FIG. 4 may be combined into a single step while other steps may be performed in multiple steps. Furthermore, it is appreciated that the bad bit detection module 116 may execute different methods for determining whether a page has a bad bit error therein.

Figure 5:
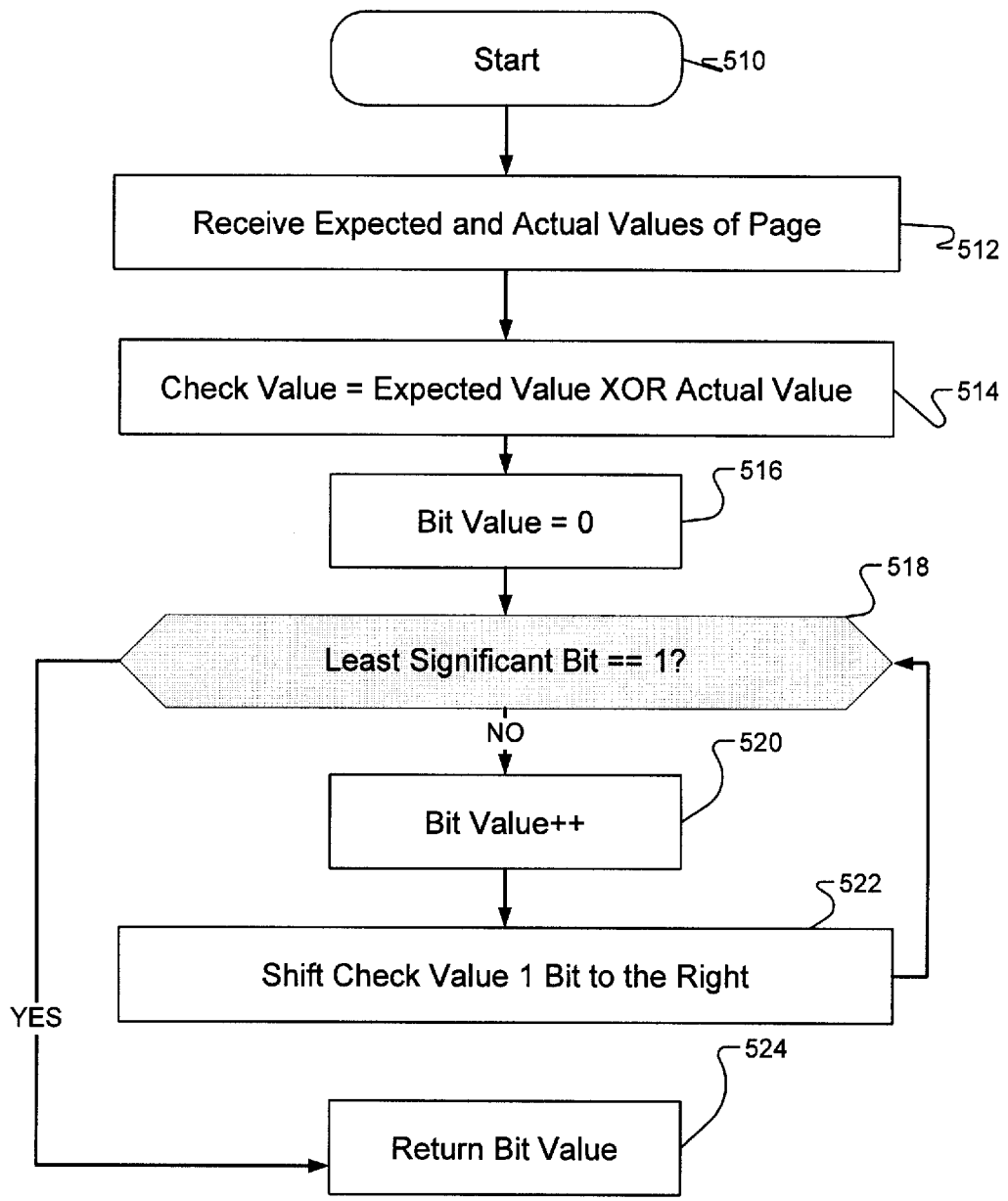
FIG. 5 is a flow chart illustrating an exemplary method for determining a location of a bad bit error.

As was described the bad bit correction module 118 will determine the location of a bad bit in a main data area of a page. FIG. 5 illustrates an exemplary method for determining the location of a bad bit in a page of memory. To determine the location of a bad bit, the bad bit correction module 118 will use the expected and actual values found in a page of memory, as shown at step 512. The bad bit correction module 118 will perform an exclusive OR (XOR) operation on the expected value and the actual value and will keep track of the results of the exclusive or operation using a check value. The check value will have a "1" for every bit where a match was not found between the expected value and the actual value. To determine the location of the bad bit, a bit value counter is set to zero as shown at step 516. The bad bit correction module 118 will then iterate through the check value to determine when a first instance of a "1" is found in the check value, as shown at step 518. If the least significant bit does not equal 1, then the bit location counter is incremented as shown at step 520. The check value is then shifted one bit to the right and the method steps back to checking the least significant bit, as shown at step 518. It is appreciated that this method will continue to execute until the least significant bit is determined to be "1" at which point the bit location counter is returned. The bad bit location is then stored in the spare data area of the page of memory as was described with respect to FIG. 3.

Figure 6:
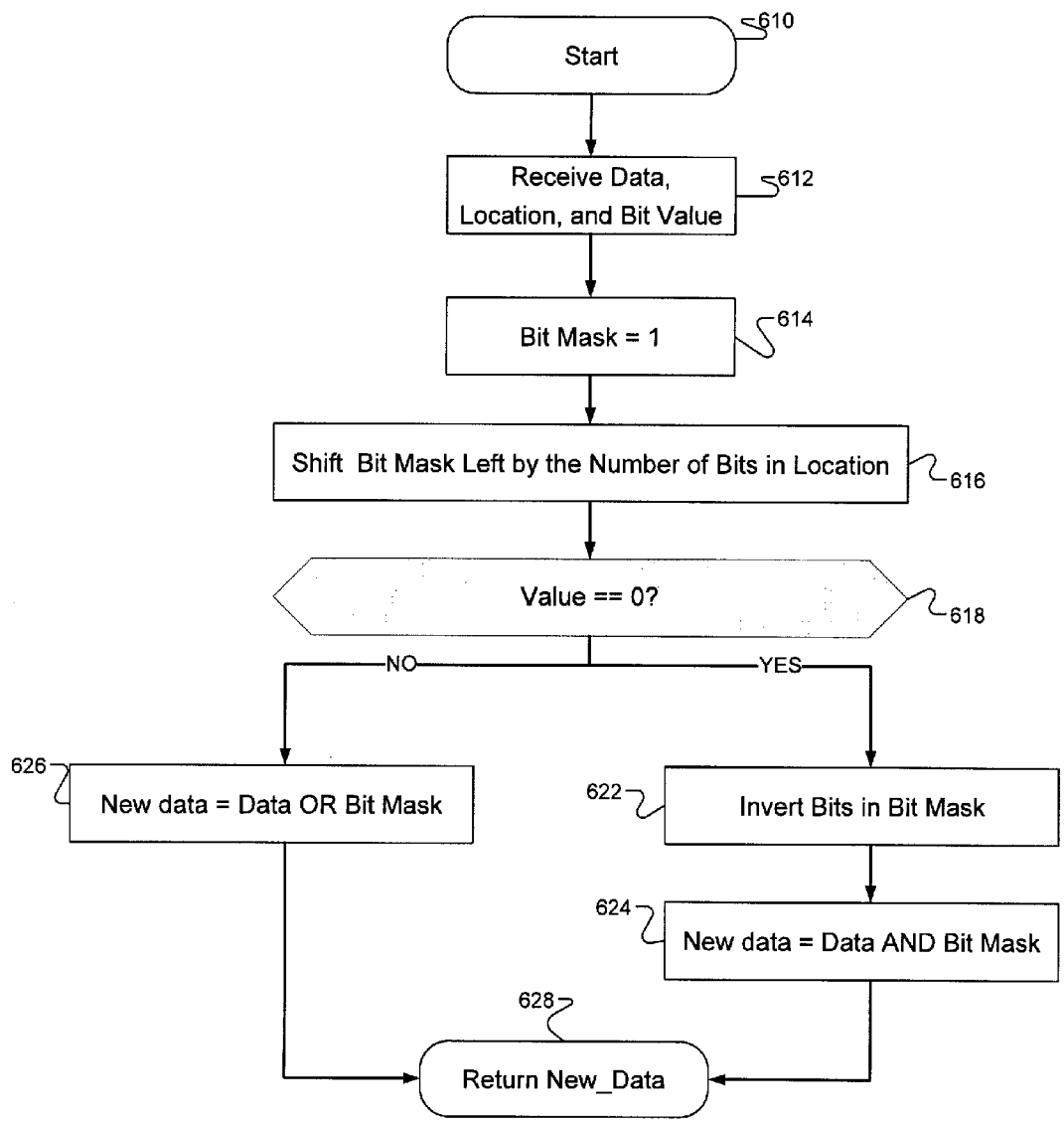
FIG. 6 is a flow chart illustrating an exemplary method for forcing a bit in a string of bits to a desired value.

It is appreciated that variations of the method may be implemented and are within the scope of this disclosure. For instance, the method may execute until 2 or more "1"s are found in the check value, such that multiple bad bit locations are determined for a single page of memory. Further, it is noted that some of the steps shown with respect to FIG. 5 may be combined into a single step while other steps may be performed in multiple steps. Furthermore, it is appreciated that the bad bit detection module 116 may execute different methods for determining the location of a bad bit As previously discussed, the bad bit correction module 118 will utilize the bit forcing module 122 to manipulate the data to be stored in the page of memory by forcing the bad bit to a particular value. FIG. 6 illustrates an exemplary method that can be executed by the bit forcing module 122. The bit forcing module will execute the following method when one of the write module 114, read module 112, or bit correction module 118 requires a bit to be forced to a particular value. To do so, the bit forcing module 122 will receive a chunk of data representing the data to be manipulated, a location of the bit to be forced, and the value to which the bit will be forced to, as shown at step 612. The location is a value, N, such that the bit to be forced in the Nth bit from either the least significant bit or the most significant bit. To force a bit to a desired value, the bit forcing module 122 will use a bit mask. The bit mask is set to 1, e.g. 0X0001, as shown at step 614. The mask is then bit shifted to the left by the value of location, as shown at step 616. For instance, if the third bit is to be forced, the bit mask is shifted to three positions to the left, e.g. 0x0004. Next, the bit forcing module will analyze the value of the bit being forced. If the bit being forced has a value of one then the bit forcing module 122 will perform an OR operation on the mask and the chunk of data, as shown at step 626. If the value of the bit being changed is zero then the bit mask is inverted, as shown at step 622, and an AND operation is performed on the chunk of data and the mask, as shown at 624. After either step 626 or 624 is performed, the new data resulting from either the OR operation or the AND operation is returned to the requesting module.

It is appreciated that variations of the method may be implemented and are within the scope of this disclosure. Further, it is noted that some of the steps shown with respect to FIG. 6 may be combined into a single step while other steps may be performed in multiple steps. Furthermore, it is appreciated that the bit forcing module 122 may execute different methods for forcing a bit to a desired value.

Figure 7:
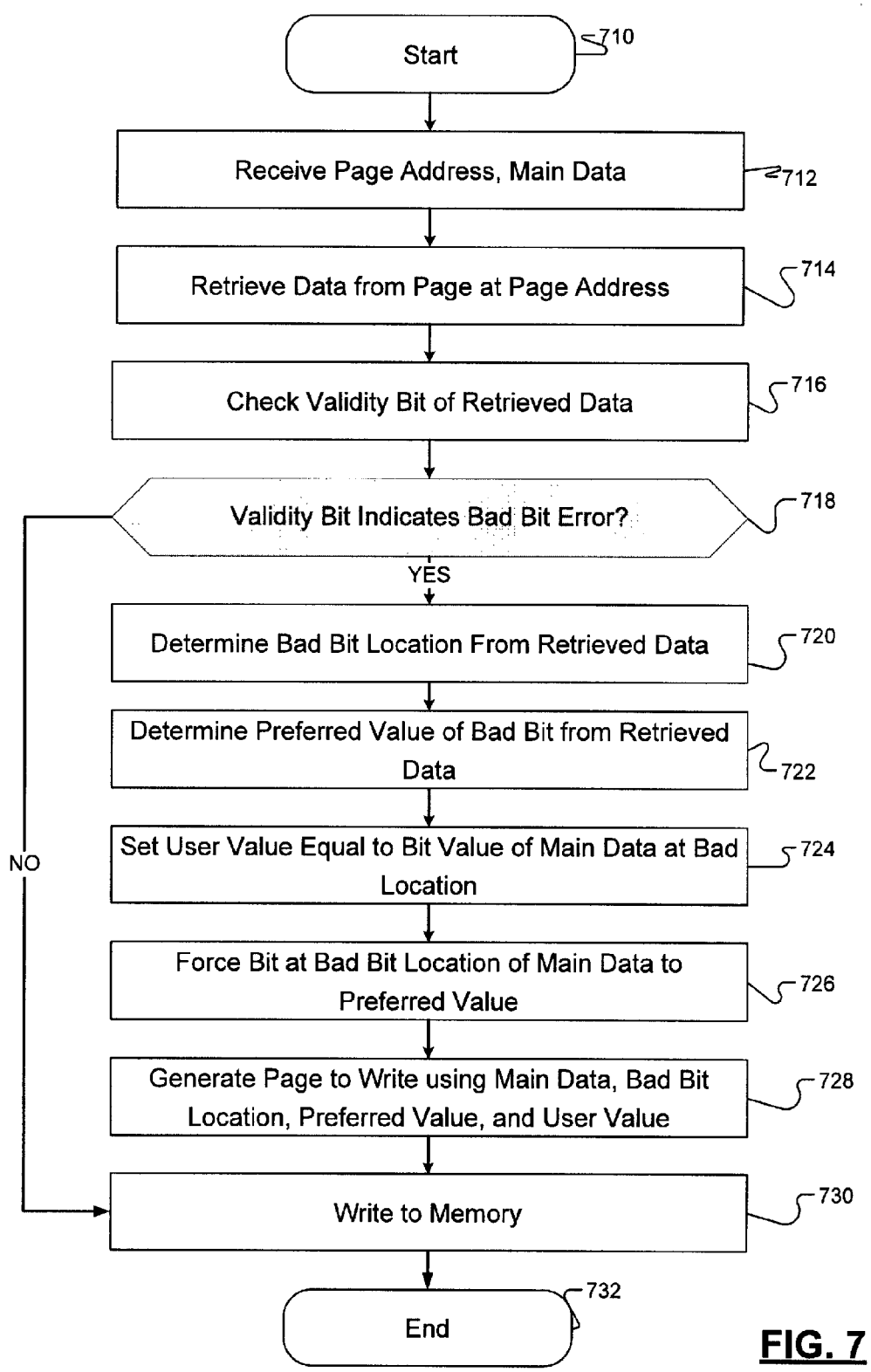
FIG. 7 is a flow chart illustrating an exemplary method for writing a page of data when the page includes a bad bit error.

When the main controller 110 requires to write to the memory device, the main controller 110 will utilize the write module 114, which is configured to remap a page of memory when the validity bit of the page of memory indicates that the page contains a bad bit. FIG. 7 illustrates an exemplary method that can be executed by the write module 114 when writing a page to the memory device 120. The write module 114 receives an address of a page to be written to and a chunk of data indicating the data to be stored in the main data area of the page as shown at step 712. Prior to writing the data, the write module 114 will read data from the retrieved page, as shown at step 714, to determine if a bad bit exists in the page to be written to, i.e. the page at the received page address. The write module 114 will retrieve the validity bit of the page, as shown at step 716, and will determine whether the bit indicates the page has a bit error, as shown at step 718. If there is no bad bit error in the page, then the write module 114 will generate a page to write using the chunk of data, while keeping the validity bit set to zero. The write module 114 will then write the page to write to memory, as shown at step 730.

It is appreciated that if a bad bit exists, then the chunk of data as well as the data in the spare data area must be manipulated so that the page is remapped. To ensure that the data is manipulated properly, the write module 114 will determine a bad bit location from the read data, as shown at step 720. The write module 114 will read the value corresponding to the bad bit location from the spare data area of the retrieved page. Similarly, the write module 114 will read the preferred value of the bad bit from the spare data area of the retrieved page, as shown at step 722. The write module 114 will determine a user value from the bit at the bad bit location in the received chunk of data, as shown at step 724. It is noted that the received chunk of data does not have a bad bit, but the bit value at the bit corresponding to bad bit value will be entered into the user value field of the page to be written.

The write module 114 will then communicate the main data, the bad bit location and the preferred value to the bit forcing module 122, such that the preferred value is inserted into the main data at the bad bit location, as shown as step 726. The write module 114 will then generate a page to write, as shown at step 728. The page to write is a data structure that corresponds to a page of memory that is to be written in a subsequent block write. The page to write will include the main data, the validity bit, a bad bit location, the preferred value and the user value. Once the page to write is generated, the write module 114 will write the page to write to memory.

It is noted that the main controller 110 may only be configured to write entire blocks at a time. Thus, the write module 114 may be configured to wait until the contents of an entire block are rewritten before writing the entire block back to the memory device 120.

It is appreciated that variations of the method may be implemented and are within the scope of this disclosure. Further, it is noted that some of the steps shown with respect to FIG. 7 may be combined into a single step while other steps may be performed in multiple steps. Furthermore, it is appreciated that the write module 114 may execute different methods for forcing a bit to a desired value.

Figure 8:
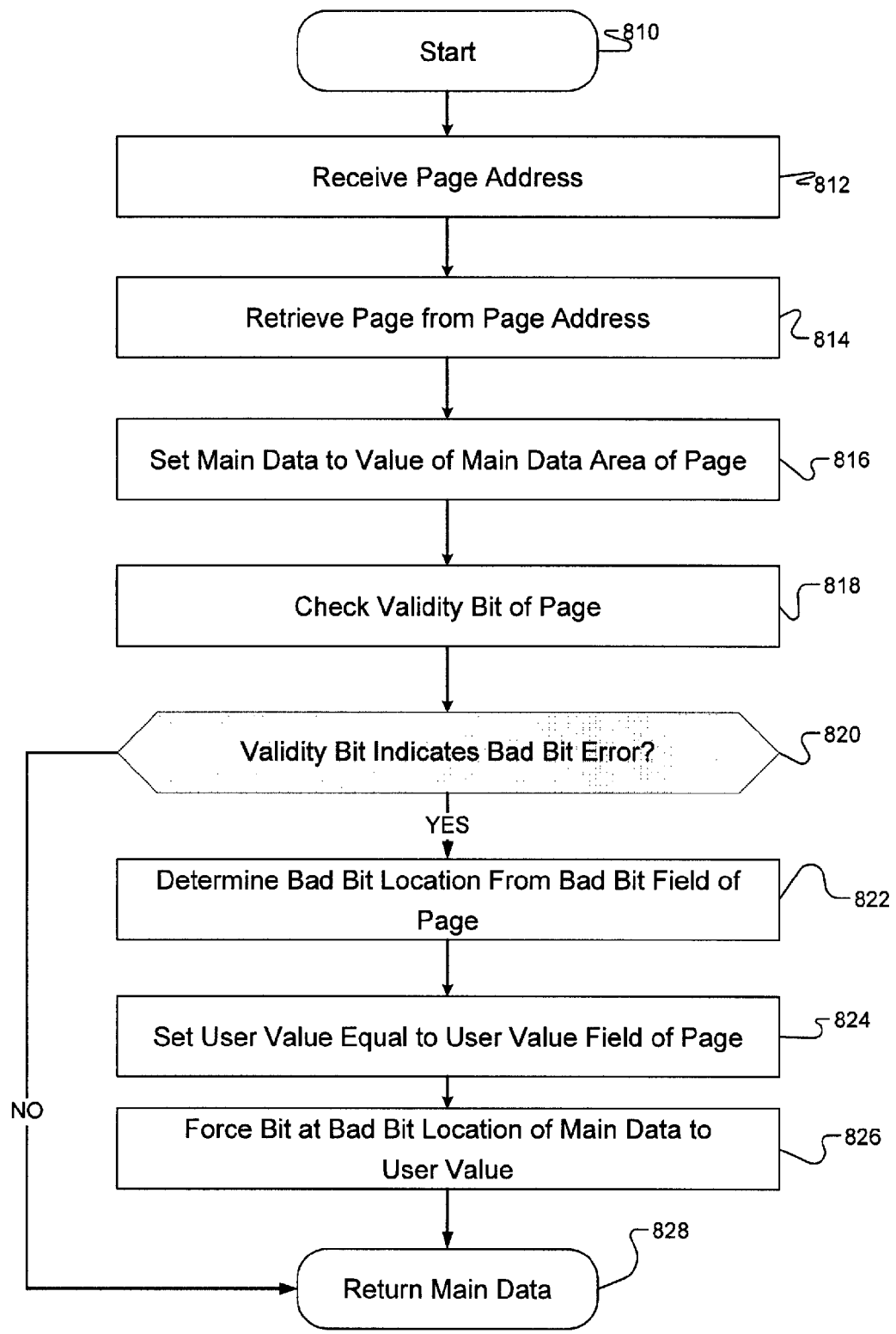
FIG. 8 is a flow chart illustrating an exemplary method for reading a page of data when the page includes a bad bit error.

When the main controller 110 requires to read to the memory device 120, the main controller 110 will utilize the read module 112, which is configured to reconfigure the main data from the main data area to compensate for a bad bit error. FIG. 8 illustrates an exemplary method that can be executed by the read module 112. The read module 112 receives an address of a page to be read from the memory device 120, as shown at step 812. The read module 112 will retrieve the requested page from the memory device 120, as shown at step 814. The read module 112 will then read the main data area of the read page, as shown at step 816. It is noted that the read module 112 can initialize a variable, e.g. main data, to store the data contained in the main data area of the read page.

The read module 112 will check the validity bit of the read page, as shown at step 818, and will determine whether the validity bit indicates a bad bit error in the read page, as shown at step 820. If the validity bit is set to 0, i.e. there is no bad bit error, the read module 114 will return main data to the requesting module and the method will stop executing, as shown at step 828.

If, however, the validity bit is set to 1, i.e., the page contains a bad bit, the read module 112 will read the bad bit location from bad bit field of the read page, as shown at step 822. The read module will also determine the user value from the user value field of the read page, as shown at step 824. For instance, if the user value field of the read page indicates that the bit located at the bad bit location is supposed to be a 1, then the user value will be set equal to 1.

The read module 114 will then communicate the variable main data, the bad bit location, and the user value to the bit forcing module 122, as shown at step 826. As previously discussed, the bit forcing module will manipulate the main data to include the user value at the bad bit location. The bit forcing module will return the main data variable with the user value included therein. The read module 122 will then communicate the main data to the requesting module, as shown at step 828.

It is appreciated that variations of the method may be implemented and are within the scope of this disclosure. Further, it is noted that some of the steps shown with respect to FIG. 8 may be combined into a single step while other steps may be performed in multiple steps. Furthermore, it is appreciated that the read module 112 may execute different methods for forcing a bit to a desired value.

Figure 9:
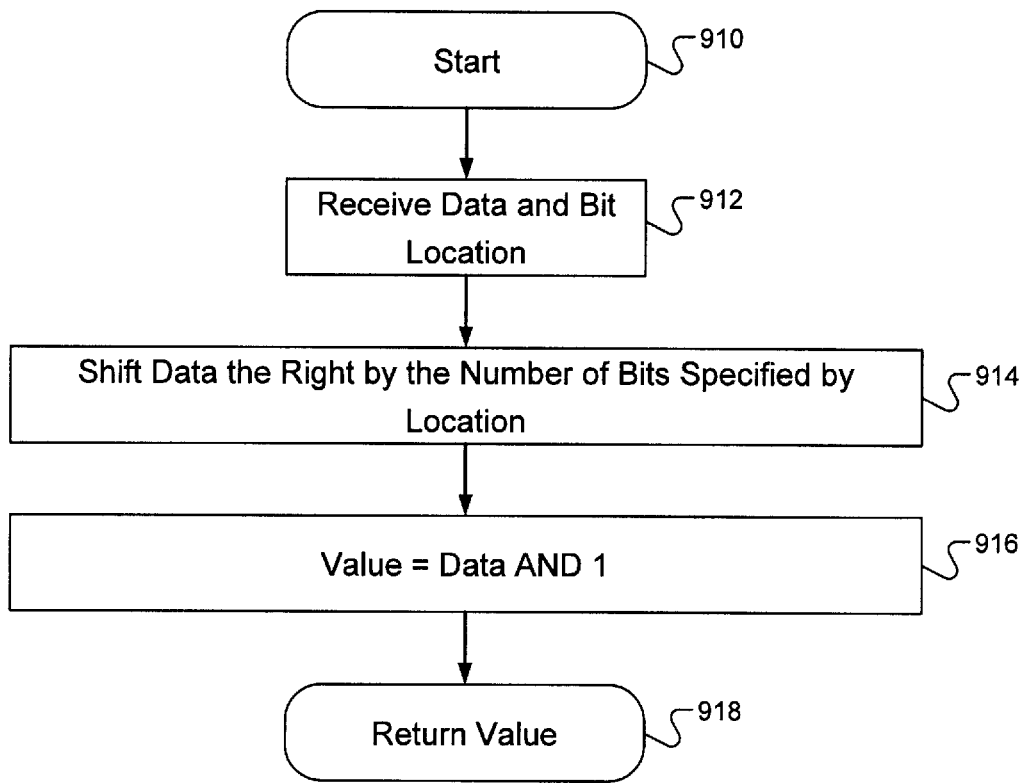
FIG. 9 is a flow chart illustrating an exemplary method for method for determining a bit value in a string of bits.

It is noted that the write module 114, the read module 112, and the bad bit correction module 118 all require at some point to determine the value of a particular bit in a string of bits. FIG. 9 illustrates an exemplary method for determining a bit value in a string of bits. The string of bits and the bit location are received, as shown in step 912. The string of data is shifted to the right by the number of bits specified by the bit location, as shown at step 914. The requested bit value is the least significant bit after the shift operation has been performed. The least significant bit can be obtained by performing an AND operation on the shifted string of bits and a mask having the value 1, i.e., 0X0001, as shown at step 916. The bit value is returned to the requesting module, as shown at step 918.

It is appreciated that variations of the method may be implemented and are within the scope of this disclosure. For instance, the mask can be shifted to the left by the number of bits specified by the bit location. Further, it is noted that some of the steps shown with respect to FIG. 9 may be combined into a single step while other steps may be performed in multiple steps. Furthermore, it is appreciated that the read module 112 may execute different methods for forcing a bit to a desired value.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A device configured to correct bad bit errors comprising:
a solid-state nonvolatile memory device divided into a plurality of blocks, each block containing a plurality of pages, each page having a main area that stores substantive data and a spare area, and each spare area having a validity bit field indicating whether a bit in the main area is in an error state, a bad bit location field indicating the bit in the main area that is in the error state, a preferred value field indicating a likely value of the bit in the main area that is in the error state, and a user value field indicating a correct value of the bit in the error state;
a main controller that performs at least one function of the device including:
a bad bit detection module that receives an old page from the solid state nonvolatile memory device and determines whether a page has a detected bit in an error state;
a bad bit correction module that:
a) generates a new page to be written to the solid-state nonvolatile memory device,
b) determines a location of the detected bit in the error state and records the location of the detected bit in the error state in a bad bit field of the new page,
c) determines a preferred value of the detected bit in the error state and records the preferred value of the detected bit in the error state in a preferred value field of the new page,
d) determines a user value of the detected bit in the error state and records the user value of the detected bit in the error state in a user value field of the new page,
e) inserts the preferred value into a string of bits corresponding to substantive data recorded in a main area of the old page, and recording the string of bits with the preferred value inserted therein in a main area of the new page, and
f) stores the new page at an address of the old page.

2. The device of claim 1, wherein the bad bit detection module:
i) reads the old page from the solid-state nonvolatile memory device when an error correcting code scheme is enabled and records contents of the main area of the old page as expected data indicating error corrected values of the main area,
ii) writes the old page back to the solid state nonvolatile memory device;
iii) reads the old page from the solid-state nonvolatile memory device when the error correcting code scheme is disabled and records the contents of the main area of the old page as actual data indicating values of the main area without any error correction;
iv) compares the expected data with the actual data, and
v) determines that the detected bit in the old page is in an error state when the expected data does not match the actual data.

3. The device of claim 2, wherein the bad bit correction module records a value of a bit in the expected data at the location of the detected bit in the error state in the preferred value field of the new page and records a value of a bit in the actual data at the location of the detected bit in the error state in the user value field of the new page with.

4. The device of claim 2, wherein the bad bit correction module determines the location of the detected bit in the main area of the old page by performing an exclusive OR operation on the expected data and the actual data, and bit shifting a result of the exclusive OR operation until a least significant bit of the result is equal to one, wherein the location of the detected bit is equal to an amount of bits shifted until the least significant bit is equal to one.

5. The device of claim 1, further comprising a write module that writes data to be written to a page to be written to, wherein the write module checks a validity bit of the page to be written to, and, when the validity bit indicates that the page to be written to is in an error state, populates a user value field of the page to be written to with a value of a bit in the data to be written corresponding to a bad bit location value stored in a bad bit location field of the page to be written to.

6. The device of claim 5, further comprising a bit forcing module that receives i) a string of bits corresponding to the data to be written, ii) a location value corresponding to the bad bit location, and iii) a requested value corresponding to a preferred value of a bit located at the bad bit location of the page to be written to, wherein the bit forcing module inserts the requested value in the data to be written at a bit location corresponding to the location value such that a main area of the page to be written to includes the data to be written with the requested value inserted therein.

7. The device of claim 1, further comprising a read module that reads a requested page from the solid state nonvolatile memory device, checks a validity bit of the requested page, and, when the validity bit indicates that the requested page is in an error state, generates requested data based on a value stored in a user value field of the requested page, a string of data stored in a main area of the requested page, and a bad bit location corresponding to a value in a bad bit location field of the requested page.

8. The device of claim 7, further comprising a bit forcing module that receives i) the string of bits stored in the main area of the requested page, ii) the bad bit location, and iii) the user value, and inserts the user value in the string of bits at a bit location corresponding to the bad bit location such that the requested data is comprised of the sting of bits with the user value inserted therein.

9. The device of claim 1, wherein the solid-state nonvolatile memory device is a NAND flash memory device.

10. A method for correcting bad bit errors in a solid-state nonvolatile memory device divided into a plurality of blocks, wherein each block contains a plurality of pages, each page includes a main area that stores substantive data and a spare area, and each spare area includes a validity bit field indicating whether a bit in the main area is in an error state, a bad bit location field indicating the bit in the main area that is in the error state, a preferred value field indicating a likely value of the bit in the main area that is in the error state, and a user value field indicating a correct value of the bit in the error state, the method comprising:

receiving an old page from the solid state nonvolatile memory device;

determining whether a page has a detected bit in an error state;

wherein when the detected bit is an error state, the method further comprises:

generating a new page that is to be written to the solid-state nonvolatile memory device;

determining a location of the detected bit in the error state and recording the location of the detected bit in the error state in the bad bit field of the new page;

determining a preferred value of the detected bit in the error state and recording the preferred value of the detected bit in the error state in the preferred value field of the new page;

determining a user value of the detected bit in the error state and recording the user value of the detected bit in the error state in the user value field of the new page, inserting the preferred value into a string of bits corresponding to substantive data of the old page, and recording the string of bits with the preferred value inserted therein in a main area of the new page; and storing the new page at an address of the old page.

11. The method of claim 10, further comprising reading the old page from the solid-state nonvolatile memory device when an error correcting code scheme is enabled and records contents of the main area of the old page as expected data indicating error corrected values of the main area, writing the old page back to the solid state nonvolatile memory device;

reading the old page from the solid-state nonvolatile memory device when the error correcting code scheme is disabled and records the contents of the main area of the old page as actual data indicating values of the main area without any error correction;

comparing the expected data with the actual data, and determining that the detected bit in the old page is in an error state when the expected data does not match the actual data.

12. The method of claim 11, further comprising recording a value of a bit in the expected data at the location of the detected bit in the error state in the preferred value field of the new page and recording a value of a bit in the actual data at the location of the detected bit in the error state in the user value field of the new page with.

13. The method of claim 11, wherein determining the location of the detected bit in the main area of the old page further comprises performing an exclusive OR operation on the expected data and the actual data, and bit shifting a result of the exclusive OR operation until a least significant bit of the result is equal to one, wherein the location of the detected bit is equal to an amount of bits shifted until the least significant bit is equal to one.

14. The method of claim 10, further comprising writing data to be written to a page to be written to, wherein the writing further comprises checking a validity bit of the page to be written to, and, when the validity bit indicates that the page to be written to is in an error state, populating a user value field of the page to be written to with a value of a bit in the data to be written corresponding to a bad bit location value stored in a bad bit location field of the page to be written to.

15. The method of claim 14, further comprising receiving i) a string of bits corresponding to the data to be written, ii) a location value corresponding to the bad bit location, and iii) a requested value corresponding to a preferred value of a bit located at the bad bit location of the page to be written to; and inserting the requested value in the data to be written at a bit location corresponding to the location value such that a main area of the page to be written to includes the data to be written with the requested value inserted therein.

16. The method of claim 10, further comprising reading a requested page from the solid state nonvolatile memory device, checking a validity bit of the requested page, and when the validity bit indicates that the requested page is in an error state, generating requested data based on a value stored in a user value field of the requested page, a string of data stored in a main area of the requested page, and a bad bit location corresponding to a value in a bad bit location field of the requested page.

17. The method of claim 16, further comprising receiving i) the string of bits stored in the main area of the requested page, ii) the bad bit location, and iii) the user value; and inserting the user value in the string of bits at a bit location corresponding to the bad bit location such that the requested data is comprised of the sting of bits with the user value inserted therein.

18. The method of claim 10, wherein the solid-state non-volatile memory device is a NAND flash memory device.

* * * * *

UNITED STATES PATENT AND TRADEMARK OFFICE
CERTIFICATE OF CORRECTION

| | |
|---|---|
| PATENT NO. | : 8,560,925 B2 |
| APPLICATION NO. | : 13/079875 |
| DATED | : October 15, 2013 |
| INVENTOR(S) | : Hughes et al. |

Page 1 of 1

It is certified that error appears in the above-identified patent and that said Letters Patent is hereby corrected as shown below:

In the Claims:

Col. 13, line 41, Claim 8, delete "sting" and insert -- string --

Col. 15, line 10, Claim 17, delete "sting" and insert -- string --

Signed and Sealed this
Twenty-eighth Day of January, 2014

Michelle K. Lee
*Deputy Director of the United States Patent and Trademark Office*